(12) United States Patent
Khasnis et al.

(10) Patent No.: US 12,040,771 B2
(45) Date of Patent: Jul. 16, 2024

(54) METHOD AND CIRCUIT FOR MATCHING IMPEDANCE AND REGULATING VOLTAGE ACROSS A LOW VOLTAGE DEVICE

(71) Applicant: Signalchip Innovations Private Limited, Bangalore (IN)

(72) Inventors: Himamshu Gopalakrishna Khasnis, Bengaluru (IN); Anantha Melavarige Subraya, Shimoga (IN); Amaresh Heggadde Shivananda, Shivamogga (IN)

(73) Assignee: SIGNALCHIP INNOVATIONS PRIVATE LIMITED, Bangalore (IN)

( * ) Notice: Subject to any disclaimer, the term of this patent is extended or adjusted under 35 U.S.C. 154(b) by 447 days.

(21) Appl. No.: 17/170,687

(22) Filed: Feb. 8, 2021

(65) Prior Publication Data
US 2022/0109417 A1 Apr. 7, 2022

(30) Foreign Application Priority Data
Oct. 6, 2020 (IN) .............................. 202041043429

(51) Int. Cl.
*H03H 7/40* (2006.01)
*H03H 1/00* (2006.01)

(52) U.S. Cl.
CPC ............ *H03H 7/40* (2013.01); *H03H 1/0007* (2013.01)

(58) Field of Classification Search
CPC .............................. H03H 7/40; H03H 1/0007
See application file for complete search history.

(56) References Cited

U.S. PATENT DOCUMENTS

| | | | |
|---|---|---|---|
| 2012/0075016 A1* | 3/2012 | Visser .................. | H04B 1/0458 330/144 |
| 2012/0121004 A1* | 5/2012 | Chang ..................... | H03H 7/40 375/232 |
| 2019/0253284 A1* | 8/2019 | Jalali Far .......... | H04L 25/03146 |

* cited by examiner

*Primary Examiner* — Samuel S Outten

(57) ABSTRACT

A circuit for matching impedance and regulating a voltage of a high radio frequency line across a low voltage device that includes a differential input port, the high radio frequency lines, an internally routed line, a singled ended peak detection circuit, and a single-ended programmable variable impedance using a single-ended programmable variable impedance. The differential input port receives a differential high radio frequency signal using driver buffers. The internally routed line boosts the received differential high-frequency RF signal. The single-ended peak detection circuit detects peak voltages of the differential high-frequency RF signal. Depending on the peak value obtained at the output of the single-ended peak detection circuit, the single-ended programmable variable impedance that matches the impedance of each of high radio frequency lines and regulates the voltage of high radio frequency lines across said low voltage device to a pre-defined voltage.

3 Claims, 3 Drawing Sheets

METHOD AND CIRCUIT FOR MATCHING IMPEDANCE AND REGULATING VOLTAGE ACROSS A LOW VOLTAGE DEVICE

BACKGROUND

Technical Field

The embodiments herein generally relate to low voltage devices protection, and more particularly, to a circuit and a method for matching impedance and regulating the voltage of a high radio frequency line of a radio frequency circuit for protecting devices that are driven by high radio frequency line in integrated circuits.

Description of the Related Art

In communication systems, a transmission line that is configured to carry alternating current of a radio frequency that includes signals with a high radiofrequency. Typically, transmission lines are used for purposes such as connecting a radio transmitter and a radio receiver with their antenna, distributing cable television signals, routing calls between telephone switching centers, computer network connections, and high-speed computer data buses and the like. However, inside integrated circuits (ICs), a distance between a source and a destination of the radio frequency signals are typically much lower than the wavelength of the radio frequency signals. In such cases, a lumped model of interconnecting consisting of a series inductor and a shunt load capacitor describes the behavior of interconnecting accurately. In such interconnects, when the frequency of an input signal is close to the resonant frequency of an inductive-capacitive (LC) network, again of the circuit is very large. During such instances, the interconnect produces an amplified version of the input signal at the output, which may not be desirable in cases where the output of the interconnect feeds circuits that have devices with a low voltage rating at their inputs.

For example, due to different locations of Phase-Locked Loop and Radio Frequency modules on the chip, the clock signal from Phase Locked Loop is routed for long distances to reach the receiver/transmitter of Radio Frequency modules. Due to the higher frequency of operation, the inherent inductance of the routing along with device and routing capacitance can cause peaking of the clock signals, voltage levels can go beyond operational range. Hence, a protection circuit and calibration mechanism are included to restrict the clock voltage to the operational level. Also, if a differential high radio frequency line is routed for long-distance inside the chip, there can be impedance differences between positive and negative lines caused by on-chip variations. The differential high radio frequency line needs to monitor and regulate the voltage across a low voltage device driven by a long line carrying radio frequency signal in integrated circuits.

SUMMARY

In view of the foregoing, an aspect herein provides a circuit for matching impedance and regulating a voltage of a high radio frequency lines across a low voltage device using a single-ended programmable variable impedance by varying impedance of each of high radio frequency lines. The circuit includes a differential input port, an internally routed line, a single-ended peak detection circuit, and a single-ended programmable variable impedance. The differential input port includes a plurality of driver buffers to receive a differential high-frequency Radio Frequency (RF) signal on the high radio frequency lines. The high-frequency line includes a positive line and a negative line. The internally routed line is modeled as an LC circuit. The internally routed line boosts the received differential high-frequency RF signal on the high radio frequency lines. The single-ended peak detection circuit that is configured detect and measure peak voltages of boosted differential high-frequency RF signal on the positive line and the negative line. The single-ended programmable variable impedance is configured to match the impedance of the voltage of high radio frequency lines and regulate the voltage of high radio frequency lines across the low voltage device. The impedance of the voltage of high radio frequency lines is matched by adjusting the impedance of the single-ended programmable variable impedance. The voltage of high radio frequency lines across the low voltage device is regulated by changing at least one of a quality factor of the internally routed line or resonant frequency of the each of high radio frequency lines for regulating the voltage of the differential high-frequency RF signal to a pre-defined threshold voltage.

In some embodiments, the single-ended programmable variable impedance is configured to match an impedance between the positive line and the negative line across a low voltage device and change at least one of variable resistance or variable capacitance of the single-ended programmable variable impedance to regulate the voltage of the differential high-frequency RF signal to the pre-defined threshold voltage. The impedance is matched between the positive line and the negative line is matched by adjusting the impedance of the single-ended programmable variable impedance.

In some embodiments, the single-ended programmable variable impedance is configured to remove the impedance mismatch between the positive line and the negative line of the high radio frequency line by adjusting the impedance of the single-ended programmable variable impedance based on a peak voltage difference between an output of the single-ended peak detection circuit of the positive line and the negative line.

In some embodiments, the single-ended programmable variable impedance comprises a variable resistance in series with a variable capacitance.

In some embodiments, the internally routed line includes an inductor that models an inductance of the high radio frequency lines and a capacitor that models a capacitance of the high radio frequency lines.

In some embodiments, the single-ended programmable variable impedance regulates the voltage of the differential high-frequency RF signal to a pre-defined value by adjusting the variable resistance and the variable capacitance of the single-ended programmable variable impedance based on the peak voltage measured at the output of single-ended peak detection circuit.

In some embodiments, the single-ended programmable variable impedance is placed in series with the high radio frequency lines, wherein the regulated voltage is applied to the low voltage device.

In another aspect, a method for matching impedance and regulating a voltage of high radio frequency lines across a low voltage device using a single-ended programmable variable impedance by varying impedance of each of high radio frequency lines is provided. The method includes (i) receiving, using a differential input port which includes a plurality of driver buffers, a differential high-frequency Radio Frequency (RF) signal, (ii) boosting, using an internally routed line, that models the high radio frequency line, the received high-frequency RF signal, (iii) detecting, using a singled ended peak detection circuit, peak voltages of the boosted high-frequency RF signal on a positive line and a negative line of the high radio frequency lines, (iv) measuring, using a single-ended peak detection circuit, the peak voltages of the differential high-frequency radio frequency signal on each of the positive line and the negative line, (v) matching the impedance of the voltage of high radio frequency lines, (vi) regulating the voltage of high radio frequency lines across the low voltage device by changing at least one of a quality factor of the internally routed line or resonant frequency of the each of high radio frequency lines for regulating the voltage of the differential high-frequency RF signal to a pre-defined threshold voltage In some embodiments, the method includes (i) matching an impedance between the positive line and the negative line across the low voltage device and (ii) changing at least one of variable resistance or variable capacitance of the single-ended programmable variable impedance to regulate the voltage of the differential high-frequency RF signal to the pre-defined threshold voltage and (iii) accurately removing, using the single-ended programmable variable impedance, the impedance mismatch between the positive line and the negative line by adjusting the impedance of the single-ended programmable variable impedance based on a peak voltage difference between an output of the single-ended peak detection circuit of the positive line and the negative line. The impedance is matched between the positive line and the negative line is matched by adjusting the impedance of the single-ended programmable variable impedance In some embodiments, the method includes adjusting, using the single-ended programmable variable impedance, the variable resistance and the variable capacitance of the single-ended programmable variable impedance based on the peak voltage to regulate the voltage of the differential high-frequency RF signal to a pre-defined value.

These and other aspects of the embodiments herein will be better appreciated and understood when considered in conjunction with the following description and the accompanying drawings. It should be understood, however, that the following descriptions, while indicating preferred embodiments and numerous specific details thereof, are given by way of illustration and not of limitation. Many changes and modifications may be made within the scope of the embodiments.

BRIEF DESCRIPTION OF THE DRAWINGS

The embodiments herein will be better understood from the following detailed description with reference to the drawings, in which.

DETAILED DESCRIPTION OF PREFERRED EMBODIMENTS

The embodiments herein and the various features and advantageous details thereof are explained more fully with reference to the non-limiting embodiments that are illustrated in the accompanying drawings and detailed in the following description. Descriptions of well-known components and processing techniques are omitted so as to not unnecessarily obscure the embodiments herein. The examples used herein are intended merely to facilitate an understanding of ways in which the embodiments herein may be practiced and to further enable those of skill in the art to practice the embodiments herein. Accordingly, the examples should not be construed as limiting the scope of the embodiments herein.

Various embodiments provide circuits and methods to regulate the voltage across a load resistor of a high radio frequency line of a radio frequency (RF) circuit. More particularly, the circuits and methods disclosed herein deal with the sensing and regulation of the voltage at the output port of the high radio frequency line to protect low voltage devices connected to a port. Also, to accurately remove the impedance mismatch between positive and negative lines of a differential long high radio frequency line.

Figure 1:
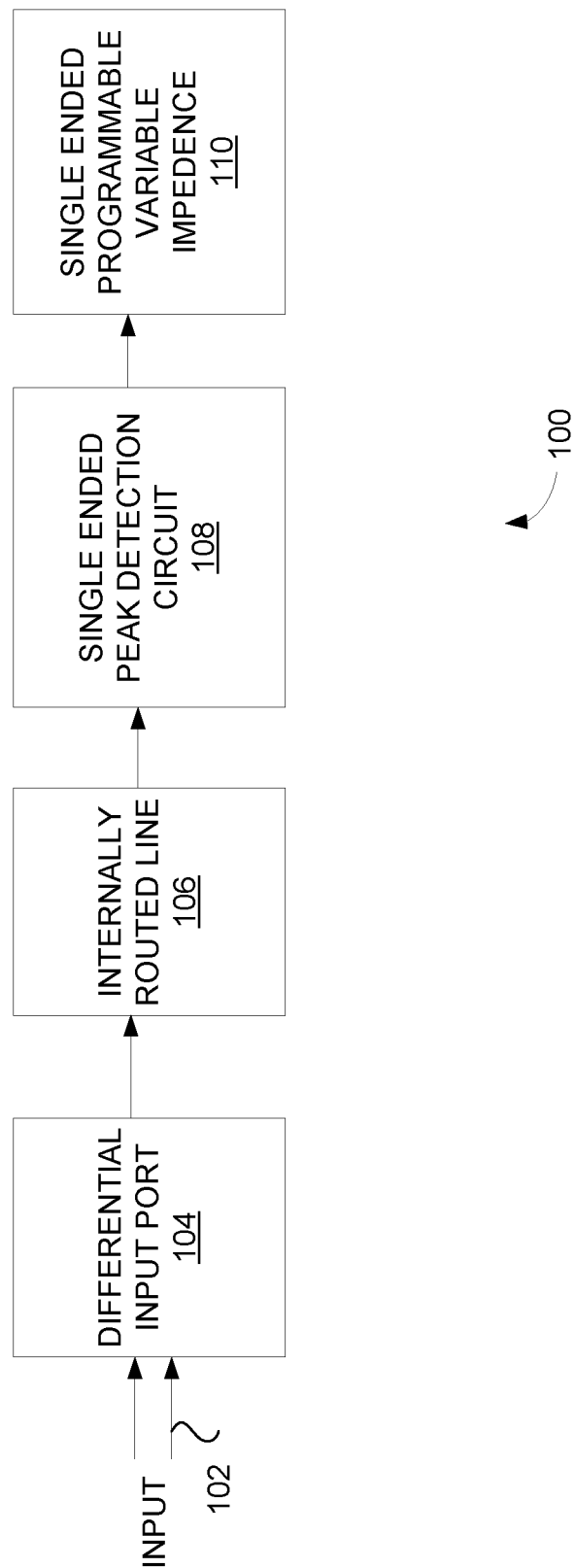
FIG. 1 illustrates a block diagram of a circuit for matching impedance and regulating a voltage of high radio frequency line across a low voltage device according to some embodiments herein.
Figure 2:
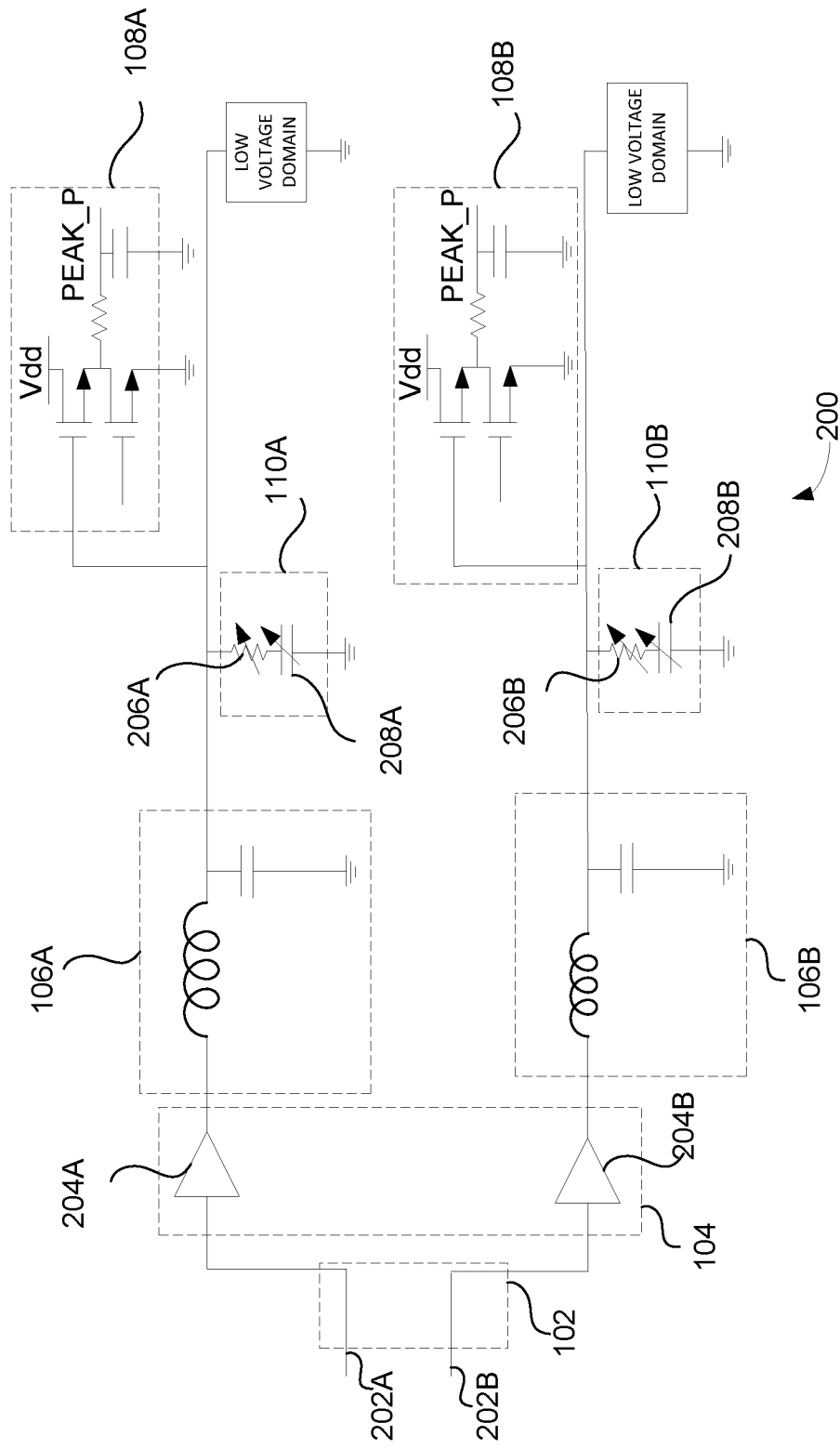
FIG. 2 illustrates a circuit for matching impedance and regulating the voltage of the high radio frequency lines across the low voltage device according to some embodiments herein.
Figure 3:
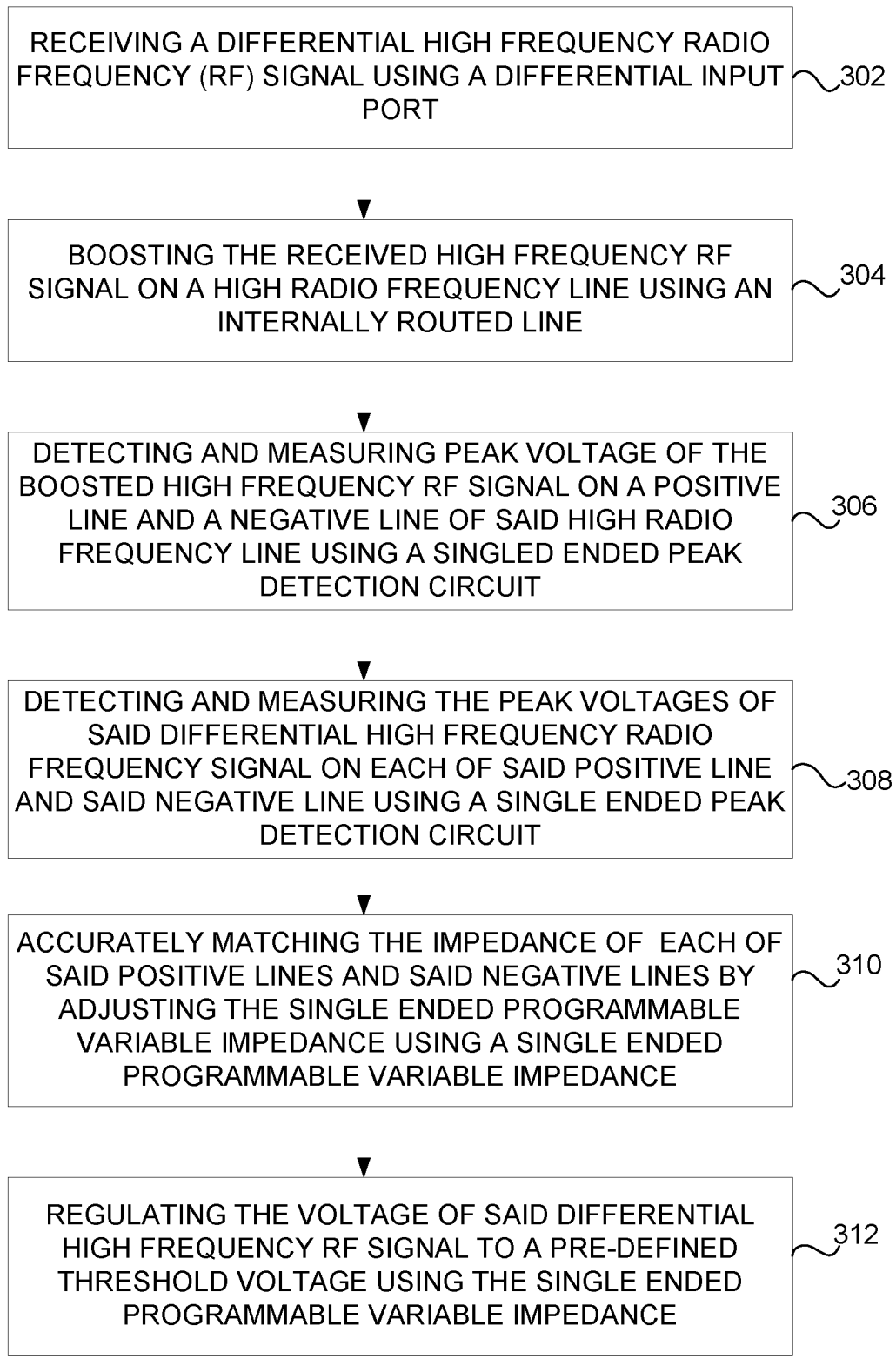
FIG. 3 is a flow diagram that illustrates a method for matching impedance and regulating a voltage of high radio frequency lines across a low voltage device according to some embodiments herein.

As mentioned, there remains a need for a circuit and a method to match the impedance and regulate the voltage across a low voltage device driven by a long line carrying radio frequency signals in integrated circuits. Referring now to the drawings, and more particularly to FIGS. 1 through 3, where similar reference characters denote corresponding features consistently throughout the figures, there are shown preferred embodiments.

FIG. 1 illustrates a block diagram 100 of a circuit for matching impedance and regulating a voltage of high radio frequency lines across a low voltage device according to some embodiments herein. The block diagram 100 includes high radio frequency lines 102, a differential input port 104, an internally routed line 106, a singled ended peak detection circuit 108, and a single-ended programmable variable impedance 110. The high radio frequency lines 102 includes a positive line and a negative line. The high radio frequency lines 102 carries a differential high Radio Frequency (RF) signal on across the low voltage device. The differential input port 104 receives a differential high radio frequency signal using driver buffers. The received differential high-frequency radio signal on high radio frequency lines 102 is modeled using the internally routed line 106. The internally routed line 106 is used to boost the received differential high-frequency RF signal on the high radio frequency lines 102. The single-ended peak detection circuit 108 (i) detects peak voltages of the differential high-frequency RF signal on each positive line and negative line and (ii) generates an output that is equivalent to peak voltage of the differential high-frequency RF signal. In some embodiments, the single-ended peak detection circuit 108 (i) detects peak voltages of the differential high-frequency RF signal on each positive line and negative line individually. Depending on the peak voltage difference between the output of single-ended peak detection circuit 108 of the positive line and the negative line, the single-ended programmable variable impedance 110 performs impedance matching between the positive line and the negative line by adjusting an impedance of the single-ended programmable variable impedance 110. Depending on the peak voltage obtained at the output of the single-ended peak detection circuit 108, the single-ended programmable variable impedance 110 regulates the voltage of the differential high-frequency RF signal to a pre-defined voltage by changing at least one of a quality factor of the internally routed line 106 or resonant frequency of the high radio frequency lines 102 by changing at least one of the variable resistance or variable capacitance of the variable impedance.

In some embodiments, the low voltage devices connected with one or more high radio frequency lines that include one or more positive lines and one or more negatives lines for the high-frequency RF signal transmission. In some embodiments, each positive lines and negative lines of the high radio frequency lines 102 connected with the differential input port 104, the internally routed line 106, the single-ended peak detection circuit 108 and the single-ended programmable variable impedance 110, for removing the impedance mismatch between the positive line and the negative line of the high radio frequency line 102 and regulating the voltage of the high radio frequency lines. The single-ended programmable variable impedance 110 controls parameters associated with each of the high radio frequency line 102 individually or together to regulate the voltage of high frequency lines across the low voltage device. In some embodiments, the parameters associated with the high frequency lines 102 includes at least one of resistance, impedance, capacitance or inductance. The single-ended programmable variable impedance 110 includes at least one of variable resistance or variable capacitance. In some embodiments, the impedance of the single-ended programmable variable impedance 110 is adjusted to match the impedance between each of the high frequency lines 102 that includes at least one of the positive line or the negative line. The variable resistance and the variable capacitance are changed by the single-ended programmable variable impedance 110 to regulate the voltage of the differential high-frequency RF signal to the pre-defined threshold voltage.

FIG. 2 illustrates a circuit 200 for matching impedance and regulating the voltage of the high radio frequency lines 102 across the low voltage device using the single-ended programmable variable impedance 110 by varying impedance of each of high radio frequency lines 102 according to some embodiments herein. The circuit 200 includes the differential input port 104, the internally routed line 106, the single-ended peak detection circuit 108, and the single-ended programmable variable impedance 110. The high radio frequency lines 102 includes a positive line 202A and a negative line 202B. The differential input port 104 includes one or more driver buffers 204A-N that are connected at each of the positive line 202A and the negative line 202B of the high radio frequency lines 110. The high-frequency lines 102 carries a differential high Radio Frequency (RF) signal across the low voltage device. The positive line 202A and the negative line 202B receive the differential high-frequency RF signal a transmission line used for the communication. The received differential high-frequency RF signal is boosted using the internally routed line 106. In some embodiments, the internally routed line 106 includes an inductor and a capacitor. The internally routed line 106 boosts the received differential high-frequency RF signal. In some embodiments, the inductance of the high radio frequency lines 102 is modeled by the inductor. In some embodiments, line capacitance and input capacitances of the circuit 200 connecting to the high radio frequency lines 102 are modeled by the capacitor. The single-ended peak detection circuit 108 detects and measures peak voltages of the differential high-frequency RF signal on each of the positive line 202A and the negative line 202B. In some embodiments, the low voltage device may include devices with low voltage ratings at an input port of the low voltage device. In some embodiments, the voltage of the boosted high radio frequency signal may increase at the output port of the radio frequency line due to inductance and capacitance of the high radio frequency line when the frequency of the high radio frequency signal is close to a resonant frequency of the internally routed line 106.

The long differential line may cause impedance mismatch between positive and negative lines due to on-chip variations. Depending on the peak voltage difference between the positive line 202A and the negative line 202B, the single-ended programmable variable impedance 110 adjusts the impedance on at least one of the positive line 202A or the negative line 202B for impedance matching between positive line 202A and the negative line 202B when an impedance mismatch is identified between positive line 202A and the negative line 202B. Depending on the peak voltage obtained at the output of the single ended peak detection circuit 108, the single-ended programmable variable impedance 110 regulates the voltage of the differential high-frequency RF signal across the low voltage device to a pre-defined threshold voltage by changing at least one of a quality factor of the internally routed line 106 or resonant frequency of the high radio frequency lines 102 by changing at least one of variable resistance 206A-N or the variable capacitance 208A-N of the single-ended programmable variable impedance 110. In some embodiments, the single-ended programmable variable impedance 110 controls the quality factor of the circuit to regulate voltage from the differential input port 104 of the high radio frequency lines 102 to the output port of the high radio frequency lines 102.

In some embodiments, the output of the single-ended peak detection circuit 108 may include voltage variation between the pre-defined voltage and the voltage of the boosted differential high-frequency RF signal. In some embodiments, the single-ended programmable variable impedance 110 may be placed in series with the high radio frequency lines 102. The single-ended programmable variable impedance 110 includes a variable resistance 206A-N in series with a variable capacitance 208A-N.

In some embodiments, the single-ended programmable variable impedance 110 regulates the voltage of the differential high-frequency RF signal to a pre-defined value by adjusting the variable resistance (206A-N) and the variable capacitance (208A-N) of the single-ended programmable variable impedance 110 based on the peak voltage measured at the output of the single-ended peak detector circuit 108. In some embodiments, the single-ended programmable variable impedance 110 is configured to accurately remove the impedance mismatch between the positive line 202A and the negative line 202B of the high radio frequency lines 102 depending on the difference in the peak voltage obtained at the output of the single-ended peak detection circuit 108 on each of positive line (202A) and negative line 202B.

FIG. 3 is a flow diagram that illustrates a method for matching impedance and regulating a voltage of the high radio frequency lines 102 across a low voltage device according to some embodiments herein. At step 302, a differential high-frequency Radio Frequency (RF) signal is received using the differential input port 104. In some embodiments, the high radio frequency lines 102 carries the differential high Radio Frequency (RF) signal on across the low voltage device. At step 304, the received high-frequency RF signal is boosted on the high radio frequency lines 102 using the internally routed line 106. At step 306, peak voltages of the boosted differential high-frequency RF signal are detected on the positive line 202A and the negative line 202B of the high radio frequency line 102 using the single-ended peak detection circuit 108. At step 308, the peak voltages of the differential high-frequency radio frequency signal are measured on each of positive line 202A and the negative line 202B using the single-ended peak detection circuit 108. At step 310, a single-ended programmable variable impedance 110 accurately matches the impedance of the positive line 202A and the negative line 202B by adjusting the single-ended programmable variable impedance 110. At step 312, the voltage of the differential high-frequency RF signal regulates to a pre-defined threshold voltage using the single-ended programmable variable impedance 110.

The foregoing description of the specific embodiments will so fully reveal the general nature of the embodiments herein that others can, by applying current knowledge, readily modify and/or adapt for various applications such specific embodiments without departing from the generic concept, and, therefore, such adaptations and modifications should and are intended to be comprehended within the meaning and range of equivalents of the disclosed embodiments. It is to be understood that the phraseology or terminology employed herein is for the purpose of description and not of limitation. Therefore, while the embodiments herein have been described in terms of preferred embodiments, those skilled in the art will recognize that the embodiments herein may be practiced with modification within the spirit and scope of the appended claims.

What is claimed is:

1. A circuit for regulating a voltage of high radio frequency lines across a low voltage device using programmable variable impedances, said circuit comprising:
    a differential input port that comprises a plurality of driver buffers to receive a differential high-frequency Radio Frequency (RF) signal on said high radio frequency lines, wherein said high radio frequency lines comprise a positive line and a negative line;
    two internally routed lines, each modelled as an LC circuit;
    two peak detection circuits that are configured to detect and measure peak voltages of said differential high-frequency RF signal on said positive line and said negative line; and
    the programmable variable impedances comprise a variable resistance in series with a variable capacitance and the programmable variable impedances are configured to
    adjust said impedance on at least one of said positive line or said negative line for impedance matching between said positive line and said negative line depending on a peak voltage difference between said positive line and said negative line when an impedance mismatch is identified between said positive line and said negative line; and
    regulate a voltage of said differential high-frequency RF signal across said low voltage device to a pre-defined threshold voltage by changing said variable resistance or said variable capacitance of the programmable variable impedances which change a quality factor and/or a resonant frequency of the high radio frequency lines.

2. The circuit of claim 1, wherein said two internally routed lines comprise
    an inductor that models an inductance of said high radio frequency lines; and
    a capacitor that models a capacitance of said high radio frequency lines.

3. The circuit of claim 1, wherein said programmable variable impedances are placed in series with said high radio frequency lines, wherein a regulated voltage is applied to said low voltage device.

\* \* \* \* \*